United States Patent
Yumoto et al.

(10) Patent No.: US 8,803,272 B2
(45) Date of Patent: Aug. 12, 2014

(54) SEMICONDUCTOR DEVICE PROVIDED WITH PHOTODIODE, MANUFACTURING METHOD THEREOF, AND OPTICAL DISC DEVICE

(75) Inventors: Hiroshi Yumoto, Kagoshima (JP); Shuji Yoneda, Kagoshima (JP); Tomokazu Mukai, Kagoshima (JP); Katsuhiko Takeuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 748 days.

(21) Appl. No.: 12/591,710

(22) Filed: Nov. 30, 2009

(65) Prior Publication Data

US 2010/0155875 A1 Jun. 24, 2010

(30) Foreign Application Priority Data

Dec. 24, 2008 (JP) ................................. 2008-328794

(51) Int. Cl.
*H01L 31/06* (2012.01)
(52) U.S. Cl.
USPC .................... 257/461; 257/463; 257/E31.032
(58) Field of Classification Search
USPC .................................... 257/463, E31.032, 461
See application file for complete search history.

(56) References Cited

U.S. PATENT DOCUMENTS

| 6,380,602 B1 * | 4/2002 | Fujisawa et al. | 257/463 |
|---|---|---|---|
| 7,808,022 B1 * | 10/2010 | Dierickx | 257/292 |
| 2007/0284624 A1 * | 12/2007 | Iwai | 257/213 |
| 2009/0115016 A1 | 5/2009 | Iwai | |

FOREIGN PATENT DOCUMENTS

| JP | 2006-210494 | 8/2006 |
|---|---|---|
| JP | 2007-317767 | 12/2007 |
| JP | 2008-066446 A | 3/2008 |

OTHER PUBLICATIONS

Japanese Office Action issued Feb. 2, 2011 for corresponding Japanese Application No. 2008-328794.

* cited by examiner

*Primary Examiner* — Zandra Smith
*Assistant Examiner* — Jamie C Niesz
(74) *Attorney, Agent, or Firm* — Rader, Fishman & Grauer PLLC

(57) ABSTRACT

A semiconductor device includes: a P-type semiconductor substrate; a first P-type semiconductor layer formed on the P-type semiconductor substrate; a second P-type semiconductor layer formed on the first P-type semiconductor layer and having a lower P-type impurity concentration than the first P-type semiconductor layer; an N-type semiconductor layer, which will form a cathode region, formed on the second P-type semiconductor layer; a first P-type diffusion layer formed by diffusing a P-type impurity in a partial region of the second P-type semiconductor layer; a second P-type diffusion layer formed by diffusing a P-type impurity in the second P-type semiconductor layer so as to be present adjacently beneath the first P-type diffusion layer at a lower P-type impurity concentration than the first P-type diffusion layer; and a photodiode formed in such a manner that the N-type semiconductor layer and the first P-type diffusion layer are isolated from each other.

17 Claims, 7 Drawing Sheets

SEMICONDUCTOR DEVICE PROVIDED WITH PHOTODIODE, MANUFACTURING METHOD THEREOF, AND OPTICAL DISC DEVICE

BACKGROUND OF THE INVENTION

1. Field of the Invention

The present invention relates to techniques of a semiconductor device provided with a photodiode, a manufacturing method thereof, and an optical disc device.

2. Description of Related Art

In an optical disc device, a photodetector IC that receives light reflected from an optical disc and converts the light to an electric signal has been used. The photodetector IC is a semiconductor device including a photodiode, which is a light receiving element, and a semiconductor integrated circuit, such as a bipolar integrated circuit and a MOS (Metal Oxide Semiconductor) integrated circuit formed of transistors and the like, all of which are formed on the same substrate.

In the semiconductor device including a photodiode and a semiconductor integrated circuit as above, incident light is converted to a current by the photodiode and the current is further converted to a voltage, and a predetermined processing is applied to the voltage to output a signal.

FIG. 13 is a schematic cross section of a semiconductor device 100 in the related art including a photodiode and a semiconductor integrated circuit. The semiconductor device 100 includes a photodiode 101 and a circuit region having an NPN-type bipolar transistor 102 and so forth.

To be more concrete, the semiconductor device 100 includes a P-type semiconductor substrate 110 and a heavily doped P-type semiconductor layer 111 is formed thereon, on which is further formed a lightly doped P-type epitaxial layer 112, which is a semiconductor layer having a lower impurity concentration than the heavily doped P-type semiconductor layer 111. Further, an N-type epitaxial layer 113 and a heavily doped N-type diffusion layer 114 are sequentially formed on the lightly doped P-type epitaxial layer 112 in a region of the photodiode 101. The heavily doped N-type diffusion layer 114 will form a charge extraction region to extract charges generated in the photodiode 101. It also plays a role of enhancing a frequency characteristic by lowering resistance of the cathode region in the photodiode 101. In addition, a heavily doped P-type diffusion layer 115 is formed adjacently to the heavily doped N-type diffusion layer 114 on the lightly doped P-type epitaxial layer 112. A lightly doped P-type diffusion layer 116 is formed adjacently beneath the heavily doped P-type diffusion layer 115.

According to the structure in the related art as above, because not only the heavily doped N-type diffusion layer 114 but also the N-type epitaxial layer 113 is a cathode region in the region of the photodiode 101, an electric field is not applied to the vicinity of the PN junction sufficiently. Accordingly, a depletion layer on the bottom surface side does not extend sufficiently, which makes a parasitic capacitance larger. In addition, because the heavily doped N-type diffusion layer 114 in the cathode region and the heavily doped P-type diffusion layer 115 that will form an anode extraction region are joined directly, a parasitic capacitance is large.

Consequently, a parasitic capacitance of the entire photodiode 101 becomes larger, which makes it difficult to make the photodiode 101 faster.

To eliminate such an inconvenience, there has been proposed a semiconductor device that reduces a parasitic capacitance by extending the depletion layer in the anode region by changing an N-type epitaxial layer in the photodiode region to a lightly doped P-type semiconductor layer by means of ion implantation as described, for example, in JP-A-2007-317767. Also, there has been proposed a semiconductor device in which a photodiode is formed directly on a P-type semiconductor layer as described, for example, in JP-A-2006-210494.

SUMMARY OF THE INVENTION

The technique described in JP-A-2007-317767, however, has a problem as follows. That is, in a case where a lightly doped P-type semiconductor layer is formed by means of ion implantation, it becomes difficult to control an impurity concentration and a depletion layer is not formed in a stable manner. A parasitic capacitance therefore becomes unstable, which causes the yields to decrease.

The technique described in JP-A-2006-210494 has a certain effect in reducing a parasitic capacitance in comparison with the configuration of FIG. 13 in the related art. However, a reduction of the parasitic capacitance is insufficiently small in extent and no consideration is given to a parasitic resistance. Because a photodiode becomes faster in inverse proportion to the product of a parasitic capacitance and a parasitic resistance, there is a problem that the effect of reducing a CR time constant is too small to make the photodiode sufficiently faster.

Thus, it is desirable to provide a semiconductor device capable of making a photodiode faster by reducing markedly a CR time constant determined by a parasitic capacitance and a parasitic resistance, a manufacturing method thereof, and an optical disc device.

According to an embodiment of the present invention, there is provided a semiconductor device including: a P-type semiconductor substrate; a first P-type semiconductor layer formed on the P-type semiconductor substrate; a second P-type semiconductor layer formed on the first P-type semiconductor layer and having a lower P-type impurity concentration than the first P-type semiconductor layer; an N-type semiconductor layer, which will form a cathode region, formed on the second P-type semiconductor layer; a first P-type diffusion layer formed by diffusing a P-type impurity in a partial region of the second P-type semiconductor layer; a second P-type diffusion layer formed by diffusing a P-type impurity in the second P-type semiconductor layer so as to be present adjacently beneath the first P-type diffusion layer at a lower P-type impurity concentration than the first P-type diffusion layer; and a photodiode formed in such a manner that the N-type semiconductor layer and the first P-type diffusion layer are isolated from each other.

The semiconductor device according to the embodiment of the present invention may be configured in such a manner that:

(1) a distance from a side end of the N-type semiconductor layer to a side end of the first P-type diffusion layer, which is a distance in a direction parallel to a surface of the P-type semiconductor substrate, is set to a range of 3.0 µm to 4.0 µm;

(2) a distance from a side end of the N-type semiconductor layer to a side end of the second P-type diffusion layer, which is a distance in a direction parallel to a surface of the P-type semiconductor substrate, is set longer than a distance from a side end of the N-type semiconductor layer to a side end of the first P-type diffusion layer;

(3) a distance from the side end of the first P-type diffusion layer to the side end of the second P-type diffusion layer is set to a range of 1.0 µm to 2.0 µm; and/or (4) the P-type impurity concentration of the first P-type semiconductor layer is set to a range of $1 \times 10^{17}$ atoms/cm$^3$ to $1\times10^{19}$ atoms/cm$^3$, the P-type impurity concentration of the second P-type semiconductor layer is set to a range of $1\times10^{13}$ atoms/cm$^3$ to $5\times10^{14}$ atoms/cm$^3$, the P-type impurity concentration of the first P-type diffusion layer is set to a range of $1\times10^{16}$ atoms/cm$^3$ to $1\times10^{18}$ atoms/cm$^3$, the P-type impurity concentration of the second P-type diffusion layer is set to a range of $5\times10^{14}$ atoms/cm$^3$ to $1\times10^{16}$ atoms/cm$^3$, and an N-type impurity concentration of the N-type semiconductor layer is set to a range of $1\times10^{18}$ atoms/cm$^3$ to $1\times10^{21}$ atoms/cm$^3$.

According to another embodiment of the present invention, there is provided a manufacturing method of a semiconductor device including the steps of: forming a first P-type semiconductor layer and a second P-type semiconductor layer having a lower P-type impurity concentration than the first P-type semiconductor layer sequentially on a P-type semiconductor substrate; forming a second P-type diffusion layer by diffusing a P-type impurity in a region which is a partial region of the second P-type semiconductor layer and in which a side end thereof is isolated from a side end of a cathode forming region on the second P-type semiconductor layer by a first distance in a direction parallel to a surface of the P-type semiconductor substrate; forming a first P-type diffusion layer having a higher impurity concentration than the second P-type diffusion layer by diffusing a P-type impurity in a region which is a partial region of the second P-type diffusion layer and a partial region of the second P-type semiconductor layer and in which a side end thereof is isolated from the side end of the cathode forming region by a second distance that is shorter than the first distance in the direction parallel to the surface of the P-type semiconductor substrate; and forming an N-type semiconductor layer in the cathode forming region.

According to the embodiments of the present invention, it is possible to provide a semiconductor device capable of markedly reducing a CR time constant determined by a parasitic capacitance and a parasitic resistance and provided with a photodiode that can be made faster. Hence, data can be read and written at a high rate with an optical disc device employing, for example, a short-wavelength laser.

DESCRIPTION OF THE PREFERRED EMBODIMENT

Figure 1:
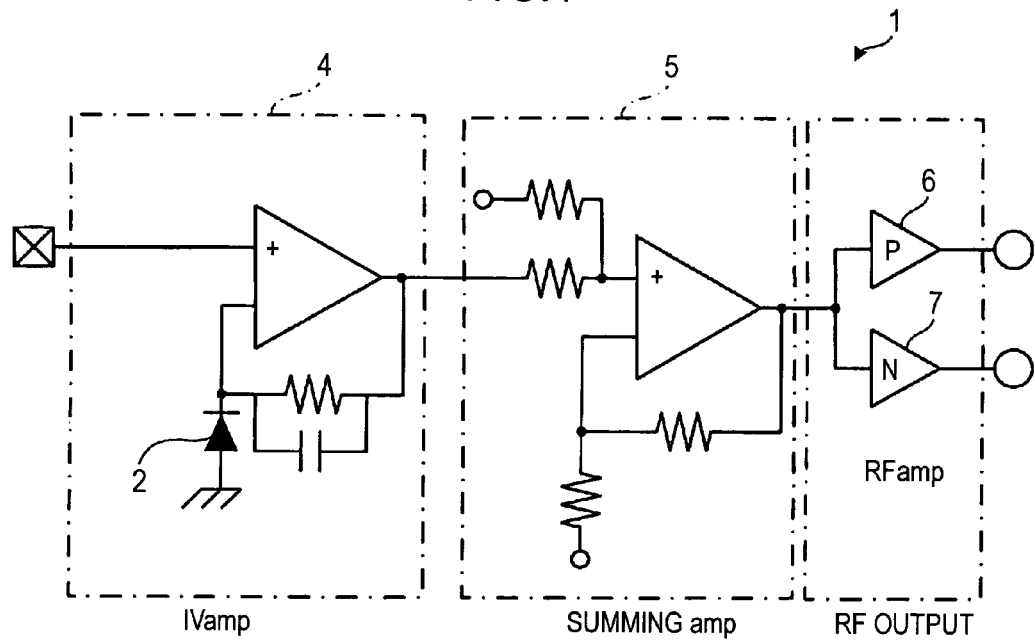
FIG. 1 is a view showing the circuit configuration of a semiconductor device according to one embodiment of the present invention.

Hereinafter, the best mode for carrying out the invention (hereinafter, simply referred to as an embodiment of the present invention) will be described in the following order.
1. Circuit Configuration of Semiconductor Device
2. Configuration and Characteristic of Semiconductor Device
3. Manufacturing Method of Semiconductor Device
4. Configuration of Optical Disc Device Incorporating Semiconductor Device
1. Circuit Configuration of Semiconductor Device Initially, the circuit configuration of a semiconductor device according to an embodiment of the present invention will be described concretely with reference to the drawings. FIG. 1 is a view showing a circuit configuration of the semiconductor device according to the embodiment of the present invention.

As is shown in FIG. 1, a semiconductor device 1 according to the embodiment of the present invention, which is also referred to as a photodetector IC, includes a photoelectric conversion circuit 4 having a photodiode 2, which is a light receiving element, an adder circuit 5, and RF amplifiers 6 and 7. The semiconductor device 1 outputs a signal corresponding to an amount of light detected by the photodetector 2.

In order to make the photoelectric conversion circuit 4 faster, it is necessary for the photodetector IC to reduce the product of a parasitic capacitance and a parasitic resistance of the photodiode 2.

Figure 2:
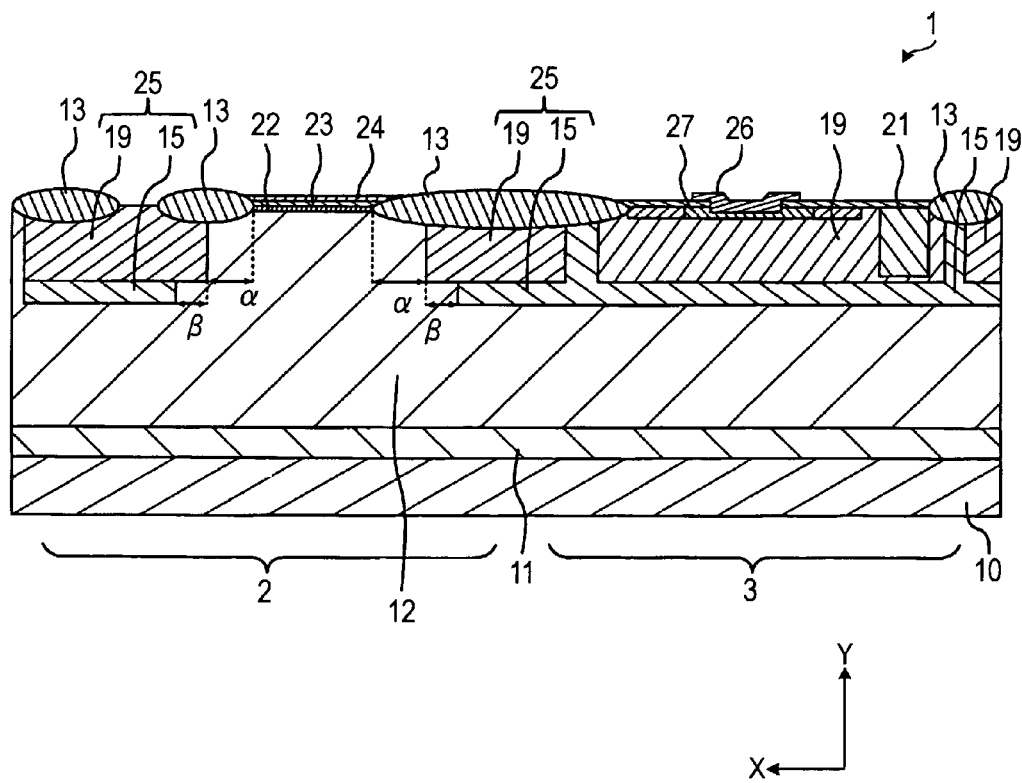
FIG. 2 is a view showing the configuration of the semiconductor device according to one embodiment of the present invention.

To this end, the inventors conducted an assiduous study and developed the semiconductor device 1 having a configuration to reduce the product of a parasitic capacitance and a parasitic resistance of the photodiode 2 by improving the side structure of the photodiode 2.
2. Configuration and Characteristic of Semiconductor Device Hereinafter, the configuration of the semiconductor device 1 according to the embodiment of the present invention will be described concretely. FIG. 2 is a view showing the configuration of the semiconductor device 1 according to the embodiment of the present invention. Herein, descriptions will be given to a case where the semiconductor device 1 is fabricated by a BiCMOS process by which a bipolar transistor is formed simultaneously in a CMOS process since the 0.25-μm generation.

As is shown in FIG. 2, the semiconductor device 1 includes a photodiode 2 and a circuit region having an NPN transistor 3 and so forth (a region in which the photoelectric conversion circuit 4 excluding the photodiode 2, the adder circuit 5, the RF amplifiers 6 and 7 are formed).

In the semiconductor device 1, a heavily doped P-type semiconductor layer 11 (an example of a first P-type semiconductor layer) that is more heavily doped with a P-type impurity (for example, boron (B)) than a P-type semiconductor substrate 10, which is a silicon substrate of P-type conduction, is formed on the P-type semiconductor substrate 10. Further, a lightly doped P-type semiconductor layer 12 (an example of a second P-type semiconductor layer) of P-type conduction doped less heavily with a P-type impurity than the heavily doped P-type semiconductor layer 11 is formed on the heavily doped P-type semiconductor layer 11. The heavily doped P-type semiconductor layer 11 may be formed by means of epitaxial growth or ion implantation of a P-type impurity. The lightly doped P-type semiconductor layer 12 is formed by means of epitaxial growth.

In a region of the photodiode 2, an N-type semiconductor layer 22 (an example of an N-type semiconductor layer) that will form a cathode region of the photodiode 2 is formed on the lightly doped P-type semiconductor layer 12. The N-type semiconductor layer 22 is isolated from other elements by an isolation oxide film 13.

Meanwhile, in the region of the photodiode 2, a lightly doped P-type diffusion layer 15 (an example of a second P-type diffusion layer) and a heavily doped P-type diffusion layer 19 (an example of a first P-type diffusion layer) are formed in a partial region of the lightly doped P-type semiconductor layer 12 other than a region beneath the N-type semiconductor layer 22. The heavily doped P-type diffusion layer 19 is a diffusion layer formed adjacently on the lightly doped P-type diffusion layer 15 and having a higher impurity concentration than the lightly doped P-type diffusion layer 15. It should be noted that the lightly doped P-type diffusion layer 15 and the heavily doped P-type diffusion layer 19 together form an anode extraction region 25 of the photodiode 2.

As has been described, the semiconductor device 1 adopts the N-EpiLess structure using no N-type epitaxial semiconductor layer as the structure of the photodiode 2 and the anode extraction region 25 of the photodiode 2 is formed of two P-type diffusion layers having different depths and concentrations.

Moreover, the anode extraction region 25 and the N-type semiconductor layer 22 are formed to be isolated by a distance $\alpha$ (an example of a second distance) in a direction (the X axis direction) parallel to the surface of the P-type semiconductor substrate 10.

When configured in this manner, a depletion layer formed in the photodiode 2 is allowed to extend, which makes it possible to reduce a parasitic capacitance of the photodiode 2.

Further, of the anode extraction region 25, the heavily doped P-type diffusion layer 19 is isolated from the N-type semiconductor layer 22 by the distance $\alpha$ in the direction (the X axis direction) parallel to the surface of the P-type semiconductor substrate 10 and the side end of the lightly doped P-type diffusion layer 15 is isolated from the side end of the heavily doped P-type diffusion layer 19 by a distance $\beta$ (an example of a first distance) in the direction (the X axis direction) parallel to the surface of the P-type semiconductor substrate 10.

Figure 3:
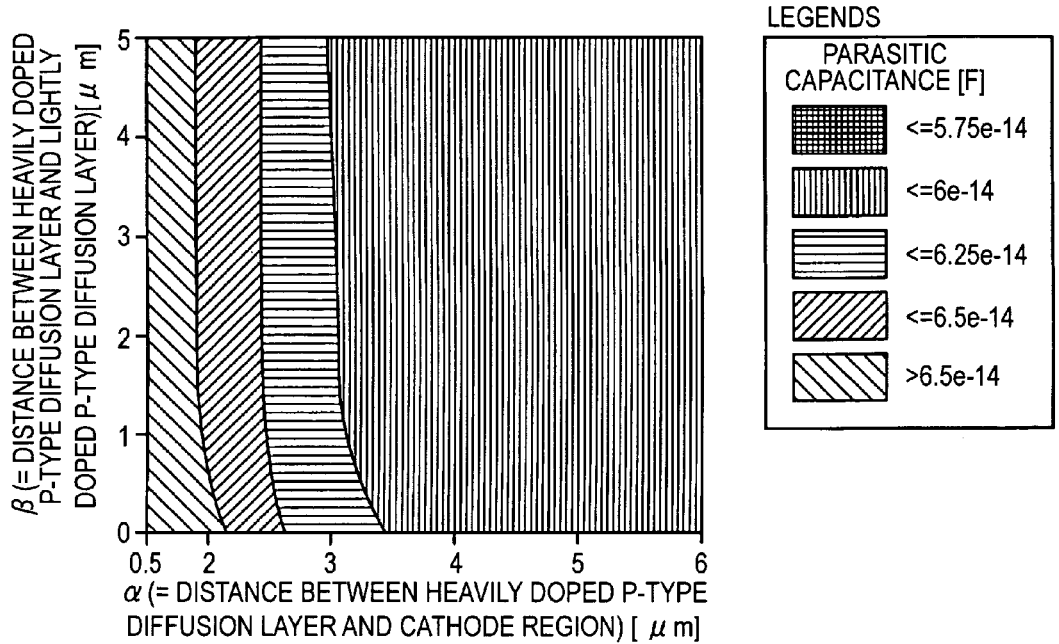
FIG. 3 is a view showing the relation of distances α and β shown in FIG. 2 and a parasitic capacitance.
Figure 4:
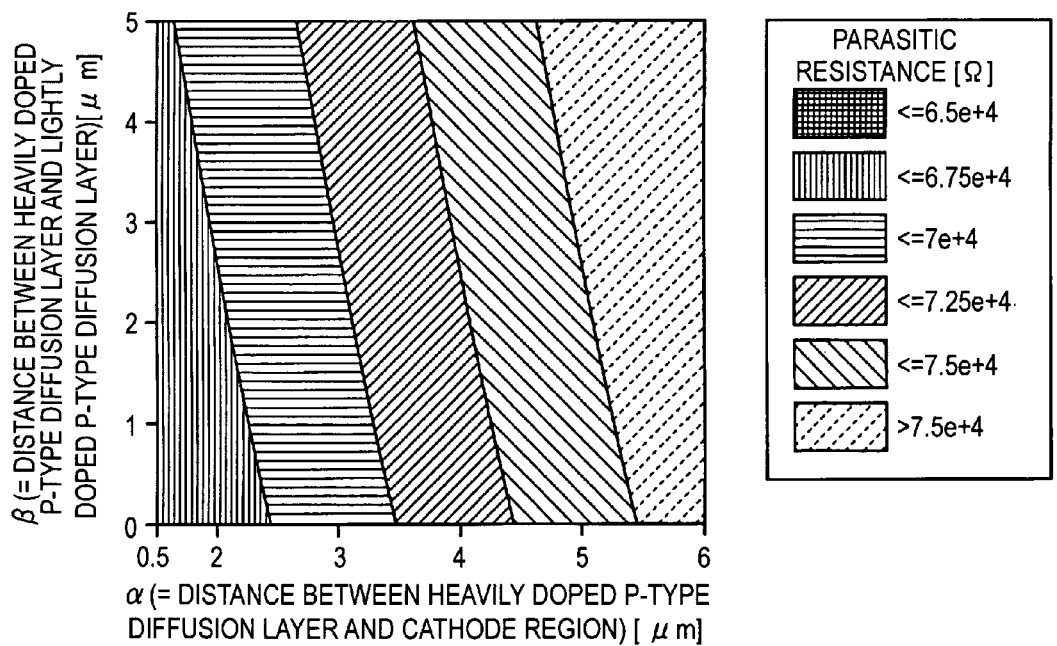
FIG. 4 is a view showing the relation of the distances α and β shown in FIG. 2 and a parasitic resistance.

The relation of the distances $\alpha$ and $\beta$ and the parasitic capacitance is shown in FIG. 3, and the relation of the distances $\alpha$ and $\beta$ and the parasitic resistance is shown in FIG. 4. Herein, the distance $\alpha$ is set to a range of 0.5 µm to 6.0 µm and the distance $\beta$ is set to a range of 0 µm to 5.0 µm.

As is shown in FIG. 3, the parasitic capacitance becomes smaller as the distances $\alpha$ and $\beta$ increase. More specifically, the parasitic capacitance becomes smaller as the heavily doped P-type diffusion layer 19 is isolated farther from the N-type semiconductor layer 22, which is the cathode region. Accordingly, it is understood that the heavily doped P-type diffusion layer 19 is isolated from the N-type semiconductor layer 22 as far as possible in a case where it is desirable to reduce the parasitic capacitance. Meanwhile, the parasitic capacitance becomes smaller as the side end of the lightly doped P-type diffusion layer 15 is isolated farther from the side end of the heavily doped P-type diffusion layer 19 in an outward direction of the photodiode 2. Accordingly, it is understood that the side end of the lightly doped P-type diffusion layer 15 is isolated from the side end of the heavily doped P-type diffusion layer 19 as far as possible in an outward direction of the photodiode 2 in a case where it is desirable to reduce the parasitic capacitance.

By contrast, as is shown in FIG. 4, the parasitic resistance becomes larger as the distances $\alpha$ and $\beta$ increase. More specifically, the parasitic resistance becomes larger as the heavily doped P-type diffusion layer 19 is isolated farther from the N-type semiconductor layer 22, which is the cathode region. Accordingly, it is understood that the heavily doped P-type diffusion layer 19 is approximated to the N-type semiconductor layer 22 as close as possible in a case where it is desirable to reduce the parasitic resistance. Meanwhile, the parasitic resistance becomes larger as the side end of the lightly doped P-type diffusion layer 15 is isolated farther from the side end of the heavily doped P-type diffusion layer 19 in an outward direction of the photodiode 2. Accordingly, it is understood that the side end of the lightly doped P-type diffusion layer 15 is approximated to the side end of the heavily doped P-type diffusion layer 19 as close as possible in a case where it is desirable to reduce the parasitic resistance.

As has been described, in order to make the photodiode 2 faster, it is necessary to improve the product of the parasitic capacitance and the parasitic resistance, that is, the CR time constant.

Figure 5:
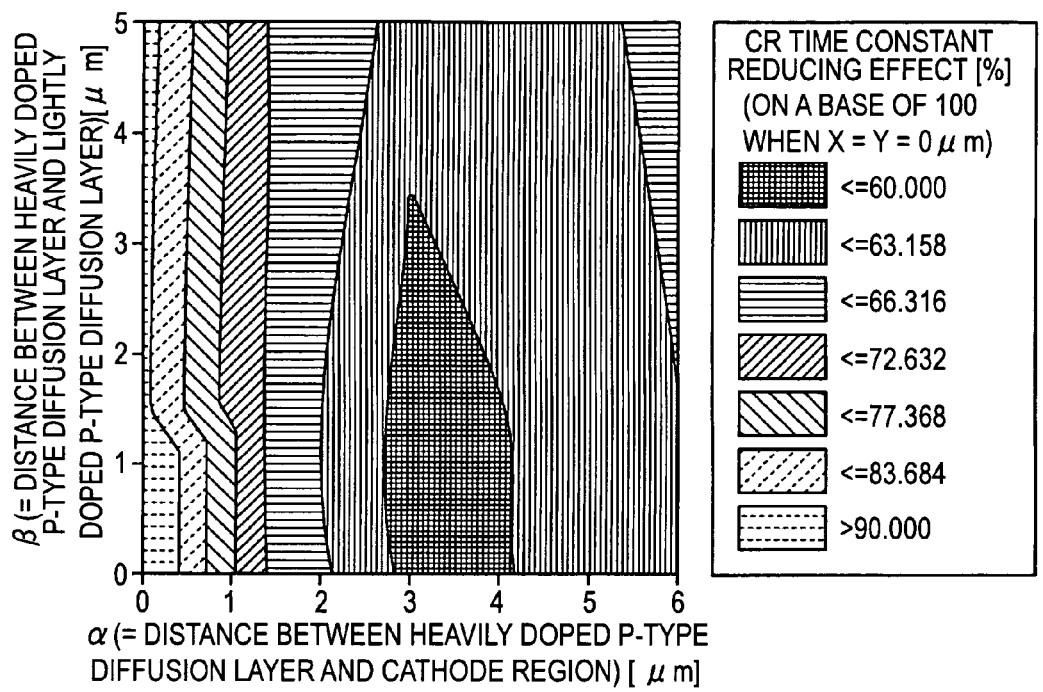
FIG. 5 is a view showing the relation of the distances α and β shown in FIG. 2 and a CR time constant (the product of the parasitic capacitance and the parasitic resistance)

The CR time constant of the photodiode 2 when the distances $\alpha$ and $\beta$ are varied is found on the basis of the results set forth in FIG. 3 and FIG. 4. FIG. 5 is a view showing the CR time constant characteristic of the photodiode 2 when the distances $\alpha$ and $\beta$ are varied.

As is shown in FIG. 5, it is understood that the CR time constant is optimal when the distance $\alpha$ is in a range of 3.0 µm to 4.0 µm and the distance $\beta$ is in a range of 0 µm to 3.0 µm. More specifically, it is understood that the CR time constant can be reduced by about 40% or more when the distance $\alpha$ is in a range of 3.0 µm to 4.0 µm and the distance $\beta$ is in a range of 0 µm to 3.0 µm in comparison with the CR time constant when both the distances $\alpha$ and $\beta$ are 0 µm.

It thus becomes possible to make the photodiode 2 faster by isolating both the heavily doped P-type diffusion layer 19 and the lightly doped P-type diffusion layer 15 from the N-type semiconductor layer 22 in the direction (the X axis direction) parallel to the surface of the P-type semiconductor substrate 10 by 3.0 µm to 4.0 µm ($\alpha$=3.0 µm to 4.0 µm, $\beta$=0 µm).

In addition, for the distance $\alpha$ set to a range of 3.0 µm to 4.0 µm, the reducing effect of the CR time constant is particularly noticeable when the distance $\beta$ is in a range of 1.0 µm to 2.0 µm, and the photodiode 2 can be made further faster.

It is therefore desirable to isolate the heavily doped P-type diffusion layer 19 from the N-type semiconductor layer 22 by 3.0 µm to 4.0 µm in the X axis direction and by isolating the side end of the lightly doped P-type diffusion layer 15 from the side end of the heavily doped P-type diffusion layer 19 by 1.0 µm to 2.0 µm in the X axis direction toward the outside of the region of the photodiode 2. It should be noted that the photodiode 2 can be made further faster by isolating the side end of the lightly doped P-type diffusion layer 15 from the side end of the heavily doped P-type diffusion layer 19 by 1.2 µm to 1.7 µm and more preferably by 1.5 µm in the X axis direction toward the outside of the region of the photodiode 2.

The parasitic capacitance becomes smaller in the absence of the lightly doped P-type diffusion layer 15, but the parasitic resistance becomes larger instead. The lightly doped P-type diffusion layer 15 is therefore a component necessary to increase the reducing effect of the CR time constant. In addition, the lightly doped P-type diffusion layer 15 is necessary in terms of relation with the other elements forming the MOS structure.

It is also understood that the photodiode 2 in the semiconductor device 1 can be made faster by setting the impurity concentrations of the heavily doped P-type semiconductor layer 11, the lightly doped P-type semiconductor layer 12, the heavily doped P-type diffusion layer 19, the lightly doped P-type diffusion layer 15, and the N-type semiconductor layer 22 to the ranges as follows:

(1) heavily doped P-type semiconductor layer 11: a range of $1 \times 10^{17}$ atoms/cm$^3$ to $1 \times 10^{19}$ atoms/cm$^3$, (2) lightly doped P-type semiconductor layer 12: a range of $1 \times 10^{13}$ atoms/cm$^3$ to $5 \times 10^{14}$ atoms/cm$^3$, (3) heavily doped P-type diffusion layer 19: a range of $1 \times 10^{16}$ atoms/cm$^3$ to $1 \times 10^{18}$ atoms/cm$^3$, (4) lightly doped P-type diffusion layer 15: a range of $5 \times 10^{14}$ atoms/cm$^3$ to $1 \times 10^{16}$ atoms/cm$^3$, and (5) N-type semiconductor layer 22: a range of $1 \times 10^{18}$ atoms/cm$^3$ to $1 \times 10^{21}$ atoms/cm$^3$.

As has been described, the semiconductor device 1 according to the embodiment of the present invention is configured in such a manner that the anode extraction region 25 of the photodiode 2 is provided so that it is isolated from the N-type semiconductor layer 22, which is the cathode region. Owing to this configuration, the photodiode 2, which is a light receiving element, is made faster by reducing the CR time constant determined by the parasitic capacitance and the parasitic resistance on the side surface. An optical disc device employing a short-wavelength laser thus becomes able to read and write data at a high rate.

Moreover, in the semiconductor device 1, the anode extraction region 25 is formed of two P-type diffusion layers (the lightly doped P-type diffusion layer 15 and the heavily doped P-type diffusion layer 19) having different depths and concentrations. The shallower heavily doped P-type diffusion layer 19 having the higher concentration is provided with an offset of the distance α with respect to the N-type semiconductor layer 22, which is the cathode region. Meanwhile, the deeper lightly doped P-type diffusion layer 15 having the lower concentration is provided with an offset of the distance β with respect to the side end of the heavily doped P-type diffusion layer 19 by isolating the side end thereof toward the outside of the region of the photodiode 2.

When configured in this manner, it becomes possible to reduce the CR time constant as small as possible, which can in turn make the photodiode 2 faster.

Moreover, circuit portions, such as the NPN transistor 3 provided with a base region 26 and an emitter region 27, are formed on the same substrate as the photodiode 2. Accordingly, it becomes possible to achieve a more compact optical disc device incorporating a photodetector IC by employing the semiconductor device 1.

3. Manufacturing Method of Semiconductor Device

A manufacturing method of the semiconductor device 1 according to the embodiment of the present invention will now be described. FIG. 6 through FIG. 11 are cross sections of the semiconductor device 1 in order of the fabrication sequence. Herein, descriptions will be given to a case where the semiconductor device 1 is fabricated by a BiCMOS process by which a bipolar transistor is formed simultaneously in a CMOS process since the 0.25-μm generation.

As a semiconductor substrate of the semiconductor device 1, the P-type semiconductor substrate 10 formed of a silicon substrate, for example, doped with a P-type impurity, such as boron (B), at a concentration in a range of $1 \times 10^{14}$ atoms/cm$^3$ to $1 \times 10^{16}$ atoms/cm$^3$ is used.

Figure 6:
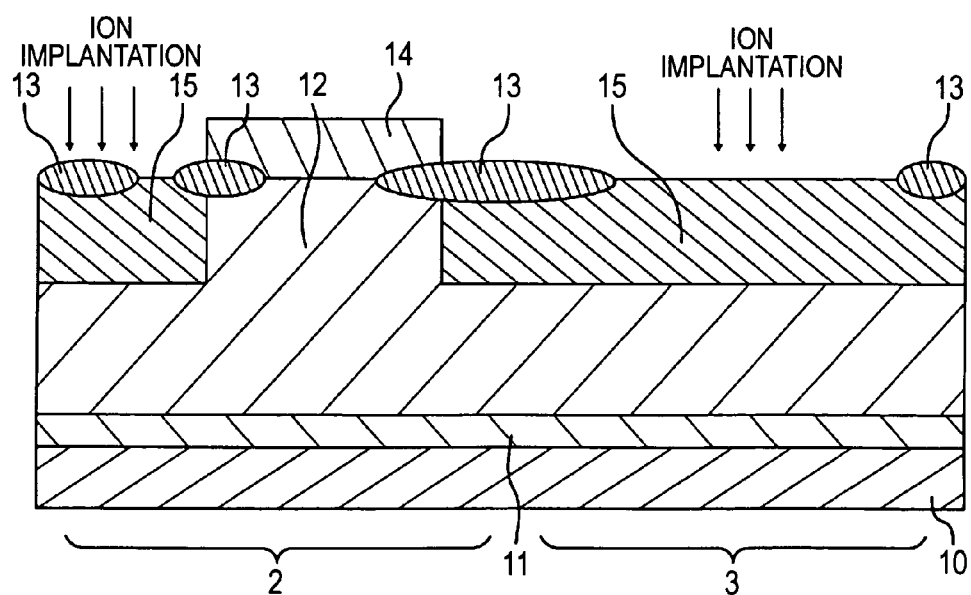
FIG. 6 is a cross section of the semiconductor device according to one embodiment of the present invention in order of the fabrication sequence.

As is shown in FIG. 6, the P-type semiconductor substrate 10 is doped with a P-type impurity, such as boron (B), at a concentration in a range of $1 \times 10^{17}$ atoms/cm$^3$ to $1 \times 10^{19}$ atoms/cm$^3$ by the epitaxy method until it deposits in a film thickness of about 5 μm to 10 μm. Alternatively, the heavily doped P-type semiconductor layer 11 may be formed by means of ion implantation of a P-type impurity.

Subsequently, the lightly doped P-type semiconductor layer 12 is deposited on the heavily doped P-type semiconductor layer 11 in a film thickness of about 13.5 μm by doping a P-type impurity, such as boron (B), at a concentration in a range of $1 \times 10^{13}$ atoms/cm$^3$ to $5 \times 10^{14}$ atoms/cm$^3$ by the epitaxy method. The lightly doped P-type semiconductor layer 12 is formed to have a lower impurity concentration than the heavily doped P-type semiconductor layer 11.

Subsequently, the isolation oxide film 13 is formed at a predetermined position by the known LOCOS (Local Oxidation of Silicon) technique so as to isolate the photodiode 2 from the NPN transistor 3 and other elements from one another. Thereafter, a resist film is formed on the surface. From this resist film, a resist film 14 patterned to perform ion implantation for diffusing a P-type impurity at a low concentration is formed using the photolithographic technique as is shown in FIG. 6.

As is shown in FIG. 6, ions of boron (B) or the like are then implanted into the lightly doped P-type semiconductor layer 12 other than a region below the cathode forming region of the photodiode 2 using the resist film 14. The lightly doped P-type diffusion layer 15 having an impurity concentration in a range of $5 \times 10^{14}$ atoms/cm$^3$ to $1 \times 10^{16}$ atoms/cm$^3$ and a depth of 4.0 μm to 6.0 μm is thus formed.

Figure 7:
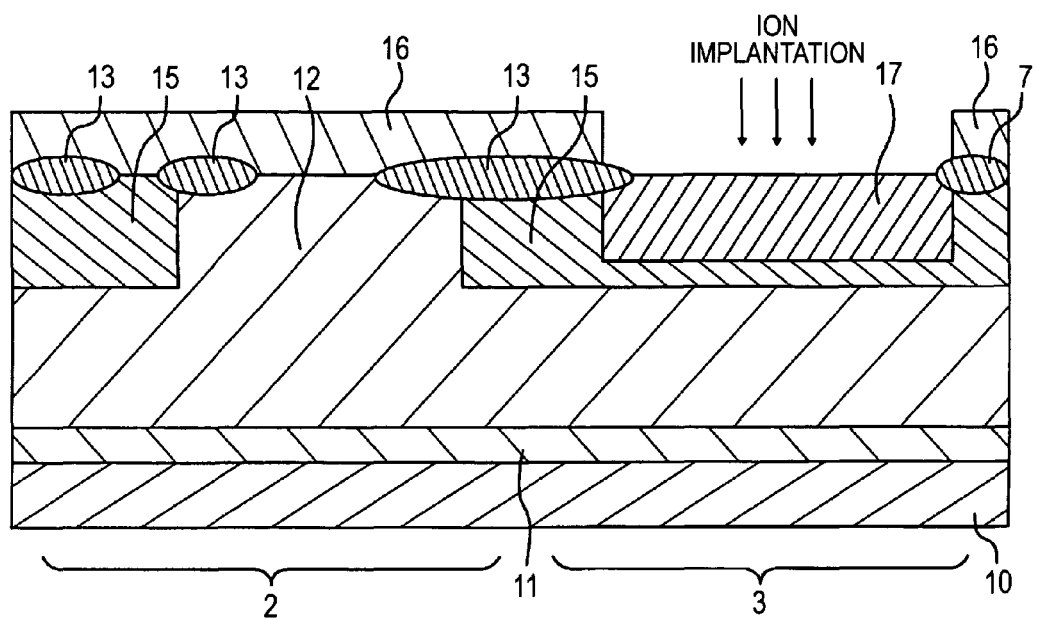
FIG. 7 is a cross section of the semiconductor device according to one embodiment of the present invention in order of the fabrication sequence.

Subsequently, a resist film is formed on the surface, and as is shown in FIG. 7, a resist film 16 patterned in such a manner that an opening is present only in a region in which a collector diffusion layer of the NPN transistor 3 is to be formed is formed on the surface using the photolithographic technique.

A collector diffusion layer region 17 of the NPN transistor 3 is then formed by implanting ions of phosphorous (P) or the like into the collector diffusion layer forming region of the NPN transistor 3 using the resist layer 16.

Figure 8:
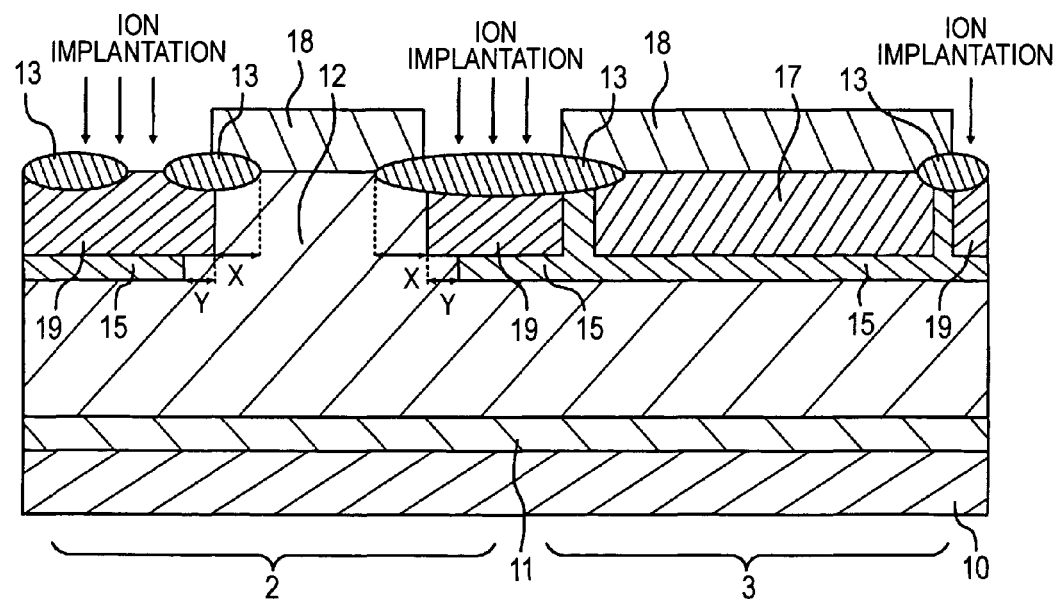
FIG. 8 is a cross section of the semiconductor device according to one embodiment of the present invention in order of the fabrication sequence.

Subsequently, as is shown in FIG. 8, a resist film 18 patterned in such a manner that openings are present only in regions in which to form an anode extraction region of the photodiode 2, an isolation layer of the NPN transistor 3, and a P well of an NMOS transistor is formed on the surface.

The heavily doped P-type diffusion layer 19 is then formed to have an impurity concentration in a range of $1 \times 10^{16}$ atoms/cm$^3$ to $1 \times 10^{18}$ atoms/cm$^3$ and a depth of 1.0 μm to 3.0 μm by implanting ions of boron (B) or the like using the resist film 18. In this instance, the N-type semiconductor layer 22 described below that will form the cathode region of the photodiode 2 and the heavily doped P-type diffusion layer 19 are formed to be isolated by 3.0 μm to 4.0 μm.

Figure 9:
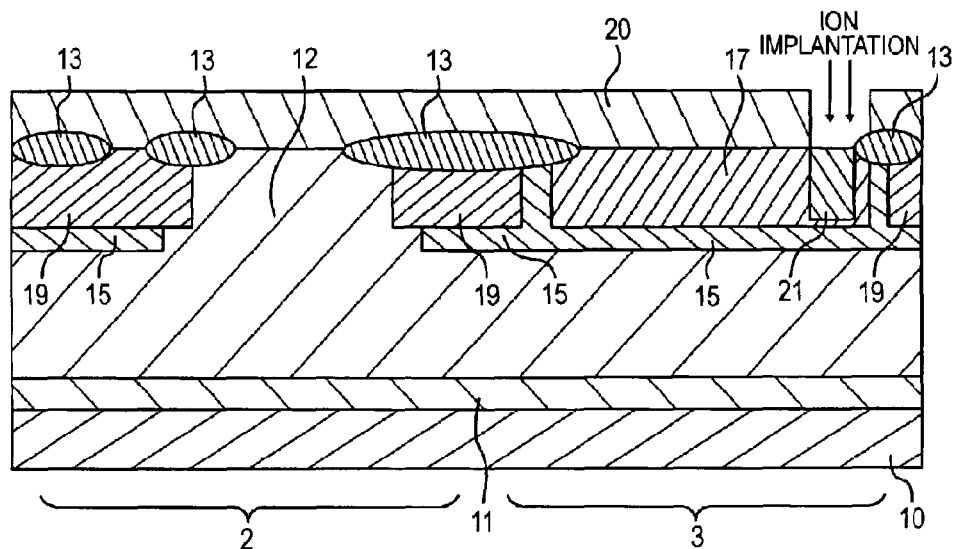
FIG. 9 is a cross section of the semiconductor device according to one embodiment of the present invention in order of the fabrication sequence.

Subsequently, as is shown in FIG. 9, a resist film 20 patterned in such a manner that openings are present only in a collector extraction region of the NPN transistor 3 and a region in which to form an N-type diffusion layer that will form an N well of an PMOS transistor is formed on the surface.

The collector extraction region of the NPN transistor 3 and the N-type diffusion layer that will form the N well of the PMOS transistor are then formed by implanting ions of phosphorous (P) or the like using the resist film 20 as a mask.

Figure 10:
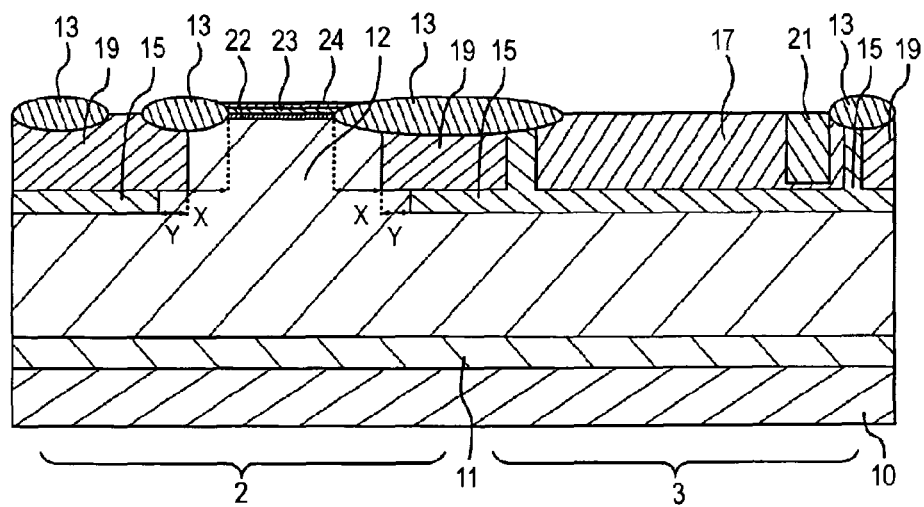
FIG. 10 is a cross section of the semiconductor device according to one embodiment of the present invention in order of the fabrication sequence.

Subsequently, a resist film patterned in such a manner that an opening is present only in a region in which to form the cathode region of the photodiode 2 is formed on the surface. The N-type semiconductor layer 22 is then formed to have an N-type impurity concentration in a range of $1\times10^{18}$ atoms/cm$^3$ to $1\times10^{21}$ atoms/cm$^3$ as shown in FIG. 10 by implanting ions of arsenic (As) or the like into the region that will form the cathode region of the photodiode 2 using the resist layer as a mask.

Thereafter, a first anti-reflection film 23 and a second anti-reflection film 24 are formed on the N-type semiconductor layer 22, which is the cathode region of the photodiode 2.

Figure 11:
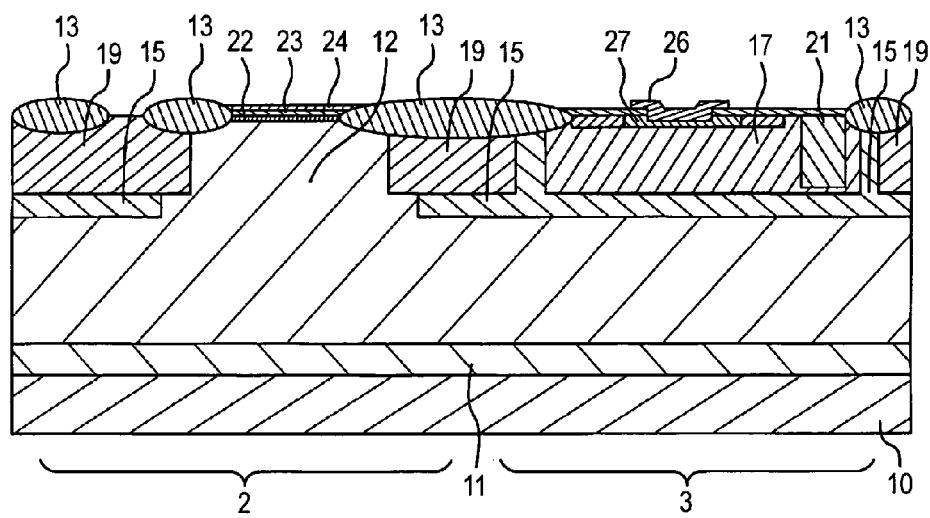
FIG. 11 is a cross section of the semiconductor device according to one embodiment of the present invention in order of the fabrication sequence.

Subsequently, as is shown in FIG. 11, the emitter region 27 is formed after the base region 26 of the NPN transistor 3 is formed.

As has been described, in the semiconductor device 1 according to the embodiment of the present invention, the photodiode 2 and circuits, such as the NPN transistor 3, are formed on the same semiconductor substrate 10.

4. Configuration of Optical Disc Device Incorporating Semiconductor Device

Figure 12:
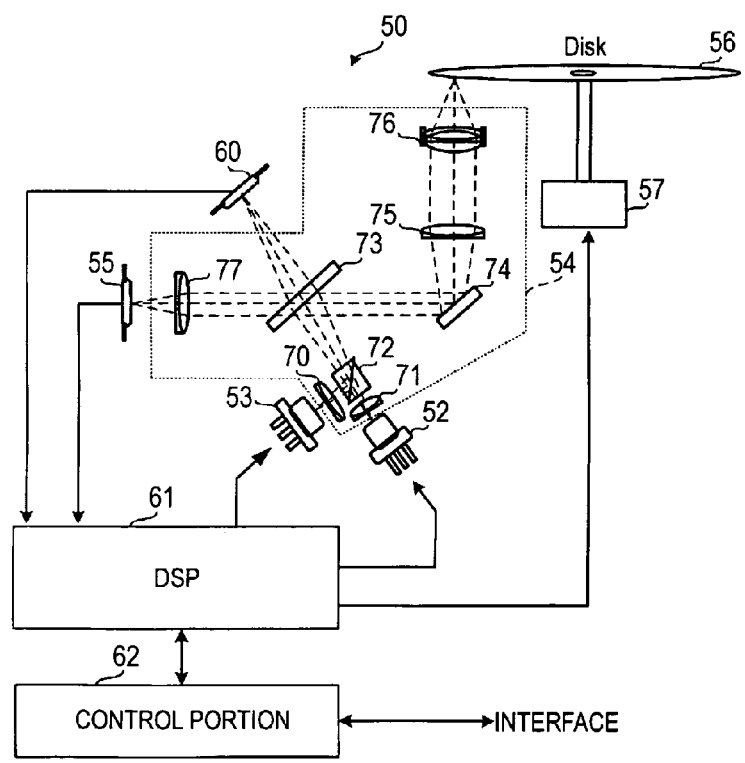
FIG. 12 is a view showing the configuration of an optical disc device incorporating the semiconductor device according to one embodiment of the present invention.
Figure 13:
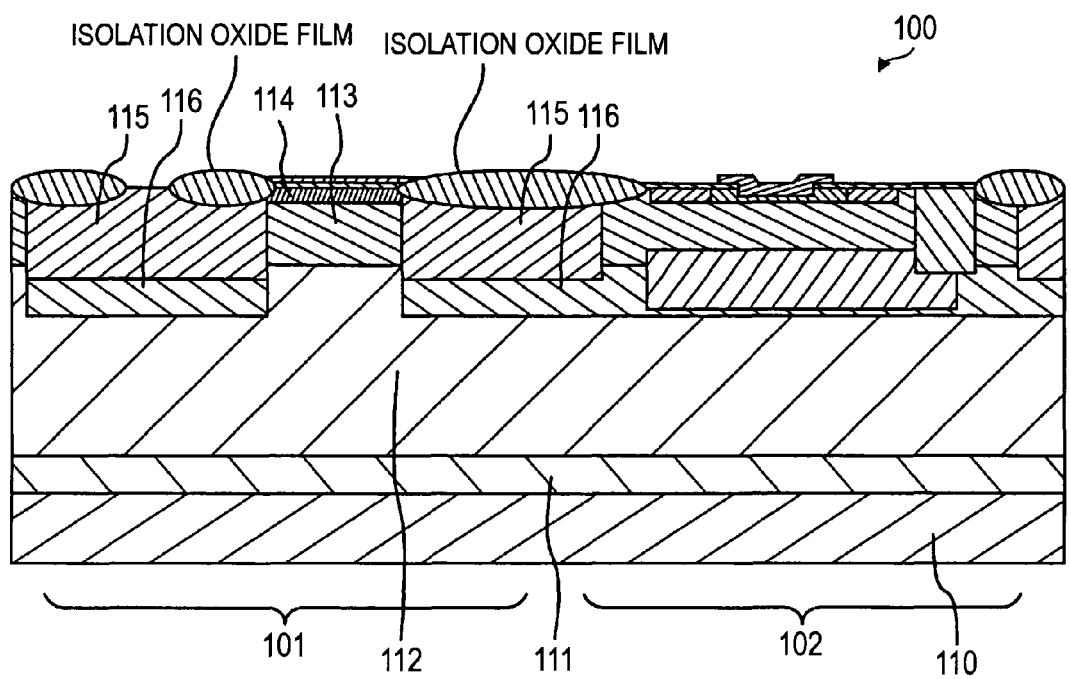
FIG. 13 is a view showing the configuration of a semiconductor device in the related art.

The semiconductor device 1 described above is incorporated into an optical disc device 50 as a PDIC 55 or a front monitor photodetector IC 60. FIG. 12 is a view showing the configuration of the optical disc device 50 incorporating the semiconductor device 1.

As is shown in FIG. 12, the optical disc device 50 includes a laser diode for CD (hereinafter, referred to as the CLD) 52, a laser diode for DVD (hereinafter, referred to as the DLD) 53, an optical system 54, a photodetector IC (hereinafter, referred to as the PDIC) 55, a front monitor photodetector IC (hereinafter, referred to as the FPDIC) 60, a servo motor 57, a DSP 61, and a control portion 62. The optical system 54 includes lenses 70, 71, and 75 through 77, a prism 72, a splitter 73, and a reflection mirror 74.

Upon receipt of recording data via an interface, the control portion 62 controls the DSP 61 so that a laser beam modulated according to the data to be recorded is emitted from the CLD 52 or the DLD 53. A laser beam emitted from the CLD 52 goes incident on the splitter 73 via the lens 71 and the prism 72. Likewise, a laser beam emitted from the DLD 53 goes incident on the splitter 73 via the lens 70 and the prism 72. The splitter 73 splits the incident laser beam to a direction of the reflection mirror 74 and a direction of the FPDIC 60. The laser beam split to the direction of the reflection mirror 74 changes the direction of light due to reflection on the reflection mirror 74. After this laser beam is collimated by the lens 75, it is collected by the lens 77 and irradiated to an optical disc 56. The laser beam irradiated to the optical disc 56 and reflected thereon is received at the PDIC 55 via the lenses 76 and 75, the reflection mirror 74, the splitter 73, and the lens 77. When data written in the optical disc 56 is read, a laser beam for reading is emitted from the CLD 52 or the DLD 53. The split laser beam is received at the FPDIC 60 in the same path as described above and the laser beam reflected on the optical disc 56 is received at the PDIC 55.

The PDIC 55 converts the received laser beam to an electric signal, which is transmitted to the DSP 61. The DSP 61 reads out data recorded in the optical disc 56 according to the electric signal transmitted from the PDIC 55 and performs control, such as a focus servo and a tracking servo. Also, the laser beam received at the FPDIC 60 is converted to an electric signal by the FPDIC 60, which is transmitted to the DSP 61. The DSP 61 detects the intensity of laser beams emitted from the respective LDs 52 and 53 according to the electric signal transmitted from the FPDIC 60 and adjusts the intensity of the laser beams to be emitted from the respective LDs 52 and 53.

While the embodiment according to the present invention has been described, it should be appreciated that the present invention is not limited to a particular embodiment and various modifications and alternations are possible within the scope of the invention set forth in the appended claims.

The present application contains subject matter related to that disclosed in Japanese Priority Patent Application JP 2008-328794 filed in the Japan Patent Office on Dec. 24, 2008, the entire contents of which is hereby incorporated by reference.

What is claimed is:

1. A semiconductor device comprising:
a heavily doped P-type diffusion layer extending from a surface of a semiconductor substrate to a lightly doped P-type diffusion layer, an impurity concentration of a P-type in the heavily doped P-type diffusion layer being higher than an impurity concentration of the P-type in the lightly doped P-type diffusion layer;
an N-type semiconductor layer extending from said surface of the semiconductor substrate to a lightly doped P-type semiconductor layer, said impurity concentration of the P-type in the heavily doped P-type diffusion layer being higher than an impurity concentration of the P-type in the lightly doped P-type semiconductor layer;
a collector diffusion layer region extending from said surface of the semiconductor substrate to said lightly doped P-type diffusion layer, an N-type impurity being within said collector diffusion layer region,
wherein a portion of the lightly doped P-type diffusion layer is between said heavily doped P-type diffusion layer and said collector diffusion layer region, said portion of the lightly doped P-type diffusion layer touching said surface of the semiconductor substrate,
wherein said lightly doped P-type semiconductor layer touches said heavily doped P-type diffusion layer and said lightly doped P-type diffusion layer, a portion of the lightly doped P-type semiconductor layer physically separating said N-type semiconductor layer from said heavily doped P-type diffusion layer.

2. The semiconductor device according to claim 1, wherein a side end of the N-type semiconductor layer is physically separated along an X axis direction from a side end of the heavily doped P-type diffusion layer by a distance alpha, said X axis direction being parallel to said surface of the semiconductor substrate.

3. The semiconductor device according to claim 2, wherein said portion of the lightly doped P-type semiconductor layer is between said side end of the N-type semiconductor layer and said side end of the heavily doped P-type diffusion layer.

4. The semiconductor device according to claim 2, wherein said N-type semiconductor layer terminates in said X axis direction at said side end of the N-type semiconductor layer.

5. The semiconductor device according to claim 2, wherein said heavily doped P-type diffusion layer terminates in said X axis direction at said side end of the heavily doped P-type diffusion layer.

6. The semiconductor device according to claim 2, wherein said side end of the heavily doped P-type diffusion layer is offset along said X axis direction from a side end of the lightly doped P-type diffusion layer by a distance beta.

7. The semiconductor device according to claim 6, wherein said lightly doped P-type diffusion layer terminates in said X axis direction at said side end of the lightly doped P-type diffusion layer.

8. The semiconductor device according to claim 6, wherein said side end of the lightly doped P-type diffusion layer is separated along the X axis direction from said N-type semiconductor layer by a sum total of the distance alpha and the distance beta.

9. The semiconductor device according to claim 1, wherein said portion of the lightly doped P-type diffusion layer physically separates said heavily doped P-type diffusion layer from said collector diffusion layer region.

10. The semiconductor device according to claim 1, wherein said lightly doped P-type diffusion layer is between said heavily doped P-type diffusion layer and said lightly doped P-type semiconductor layer.

11. The semiconductor device according to claim 1, wherein said portion of the lightly doped P-type semiconductor layer touches said surface of the semiconductor substrate.

12. The semiconductor device according to claim 1, wherein said portion of the lightly doped P-type semiconductor layer touches said heavily doped P-type diffusion layer and said N-type semiconductor layer.

13. The semiconductor device according to claim 9, wherein part of said surface of the semiconductor substrate is between an isolation oxide film and said portion of the lightly doped P-type semiconductor layer.

14. The semiconductor device according to claim 13, wherein said portion of the lightly doped P-type semiconductor layer touches said isolation oxide film.

15. The semiconductor device according to claim 1, further comprising:
 a heavily doped P-type semiconductor layer between said lightly doped P-type semiconductor layer and another surface of the semiconductor substrate.

16. The semiconductor device according to claim 15, wherein a P-type impurity concentration in the lightly doped P-type semiconductor layer is lower than a P-type impurity concentration in the heavily doped P-type semiconductor layer.

17. An optical disc device comprising:
 the semiconductor device according to claim 9; and
 an optical system, said semiconductor device being configured to receive a laser beam from said optical system.

* * * * *